INVENTOR.
FREDERICK A. SCHWERTZ
EDWARD F. MAYER
Stanley Z. Cole
Anthony D. Cennamo
ATTORNEY INVENTOR.
FREDERICK A. SCHWERTZ
EDWARD F. MAYER
Stanley Z. Cole
Anthony D. Cennamo
ATTORNEY INVENTOR.
FREDERICK A. SCHWERTZ
EDWARD F. MAYER
Stanley Z. Cole
Anthony D. Cennamo
ATTORNEY INVENTOR.
FREDERICK A. SCHWERTZ
EDWARD F. MAYER
Stanley Z. Cole
Anthony D. Cennamo
ATTORNEY

THIN FILM PRINTED CIRCUIT

Filed Nov. 20, 1963 5 Sheets-Sheet 5

INVENTOR.
FREDERICK A. SCHWERTZ
EDWARD F. MAYER

Stanley Z. Cole
Anthony D. Cennamo
ATTORNEY 3,352,731
THIN FILM PRINTED CIRCUIT Frederick A. Schwertz and Edward F. Mayer, Pittsford, N.Y., assignors to Xerox Corporation, Rochester, N.Y., a corporation of New York Filed Nov. 20, 1963, Ser. No. 324,966
3 Claims. (Cl. 156—11)

This application is a continuation in part of application, Ser. No. 212,083 filed July 24, 1962.

The invention relates to novel method and apparatus of image reproduction. The invention also relates to novel method for forming electrical printed circuits and the products thereof.

With an ever-increasing yield of information of various forms, there has arisen concomitant need for improvements in recording the information. Thus many purposes exist for which it may be desired that original information be reproduced, as, for example, to effect wide dissemination, to effect permanent records of otherwise passing information, to effect size reduction for storage purposes, etc. In other instances, it is desired to transpose information into more useful form. Thus original intelligence or information which is transmitted in the form of electrical signals or the like may be impossible to comprehend unless recorded for subsequent analysis.

It has long been desired that a reproduction system be available that would accord flexibility in the ultimate reproduction form and, at the same time, offer the versatility of controlled fidelity, wide latitudes of sensitivity and yet be compatible for either high or low speed information output systems. For example, one of the more rapid electronic methods of producing alphabetical and numerical symbols or characters involves the use of a shaped beam cathode-ray tube. In such a device, the character is created on the tube face by projecting an electron beam through a very small aperture of a desired pattern. Generally the tube face is relatively small and the light intensity at the face is relatively low. These factors limit direct visual display as well as large scale presentations of the information produced. To create this information in more valuable form, a recording system having broad capabilities of speed, sensitivity and fidelity becomes a highly desired device. When considering military purposes, it is frequently desirable to project information in negative form in order that information received from a plurality of different sources can be quickly and readily compared side by side or in an overlap relationship. It is usually a requirement for such applications that the transparencies be of high resolution. It is also a usual requirement that the copy be formable at a high rate of speed consistent with the output rate of the information source. When such a reproduction rate is possible, lag is prevented and a need to store incoming material is dispensed with.

At the same time, a technical revolution in recent years has been occurring in electronics. In keeping with the growing need for complexity in electronic circuitry, techniques have been developed so that the fabrication of electronic circuit assemblies increasingly has been automated whereby the laborious hand assembly previously required has been substantially reduced. One technique which has contributed to this recent advance is the development of printed circuits wherein printed conductors or the like on a dielectric substrate connect the various passive circuit elements thereby eliminating the necessity of individual soldered wire connections. Printed circuits and their fabrication have become well known and essentially consist of a dielectric substrate on which is formed electrical conducting lines, resistive lines, capacitors and the like.

With the growing change from tube circuits to transistor circuits, a new technique known as micro-miniaturization has led to the development of a module system of forming electric assemblies. This system has been pioneered by Diamond Ordinance Fuse Laboratories. In this system, a flat plate or substrate is processed to form the resistors, condensers, and conductive lines while the three-dimensional components, generally as packaged elements such as transistors and diodes, are inserted to form the complete circuit. As the thin film circuit elements, that is the resistors, condensers and conductive lines are formed on the wafer itself, they are essentially two-dimensional circuit components. Thus, such circuits are generally termed "two-dimensional" or "2-D" circuits. Generally, 2-D circuits have been formed by evaporation processes or by forming stencils corresponding to the separate circuit elements and successively evaporating the different compounds through the successive stencils thereby forming these precise circuit elements in the precise place desired on the substrate.

In the module technique of circuit miniaturization, a wafer of uniform size is selected as, for example, a dielectric substrate 1" by 1" or whatever size is deemed suitable. Substrate circuit components are then assembled or formed in sections on the individual wafer. Complete circuits are then formed by combining individual wafers which may be arranged in parallel, held fixed, for example, by means of rigid end-plates which may themselves contain sections of circuit components. Three dimensional elements may then be attached to either the wafers or the end plates.

The prior art, therefore, has made significant advances in printed circuit technology including advances in techniques of micro-miniaturization, but the art has been largely handicapped by the inability to produce the circuit panels in volume and on demand as required. Thus, panel production heretofore has been largely on an individual basis in which the individual panel is hand processed through the various mechanical and chemical steps in accordance with requirements. Therefore, despite all the advances in the art, fabrication of printed circuits has been slow, tedious cumbersome and inaccurate and not adapted to producing microcircuits in volume with a high degree of precision. For example, it is conventional in the printed circuit art to use large boards cut to approximate final size from much larger stock such that the circuit elements thereon need not be precisely located within the area of the board. After forming the circuit, the board is trimmed to final dimensions. This prior procedure cannot conveniently be applied to microcircuitry wherein the boards may be comprised of thin wafers, one inch square or less, and on which, unless the compenents are precisely located and formed, utility of the circuit is destroyed.

It is therefore an object of the invention to provide novel method and apparatus for the recording or production of information.

It is a further object of the invention to provide novel method and apparatus for the formation of either negative and/or positive image reproductions.

It is a still further object of the invention to provide novel method and apparatus for the simultaneous formation of complementary negative and positive image reproductions.

It is a still further object of the invention to provide novel method and apparatus for forming high density, low contrast reproductions from relatively low density, low contrast original images.

It is a still further object of the invention to provide novel method and apparatus for rapid transformation of information intelligence into high resolution reproduction expediently and relatively inexpensive as compared to known methods or prior art.

It is a still further object of the invention to provide novel methods for forming microcircuit electrical components.

It is a still further object of the invention to provide novel methods for forming printed circuit components more rapidly and with greater precision than has been known heretofore.

It is a still further object of the invention to provide novel microcircuit panels formed in accordance with the novel methods hereof.

Other objects and advantages of the present invention will be more readily apparent in view of the following detailed description, especially when read in conjunction with the accompanying drawings wherein.

Figure 1:
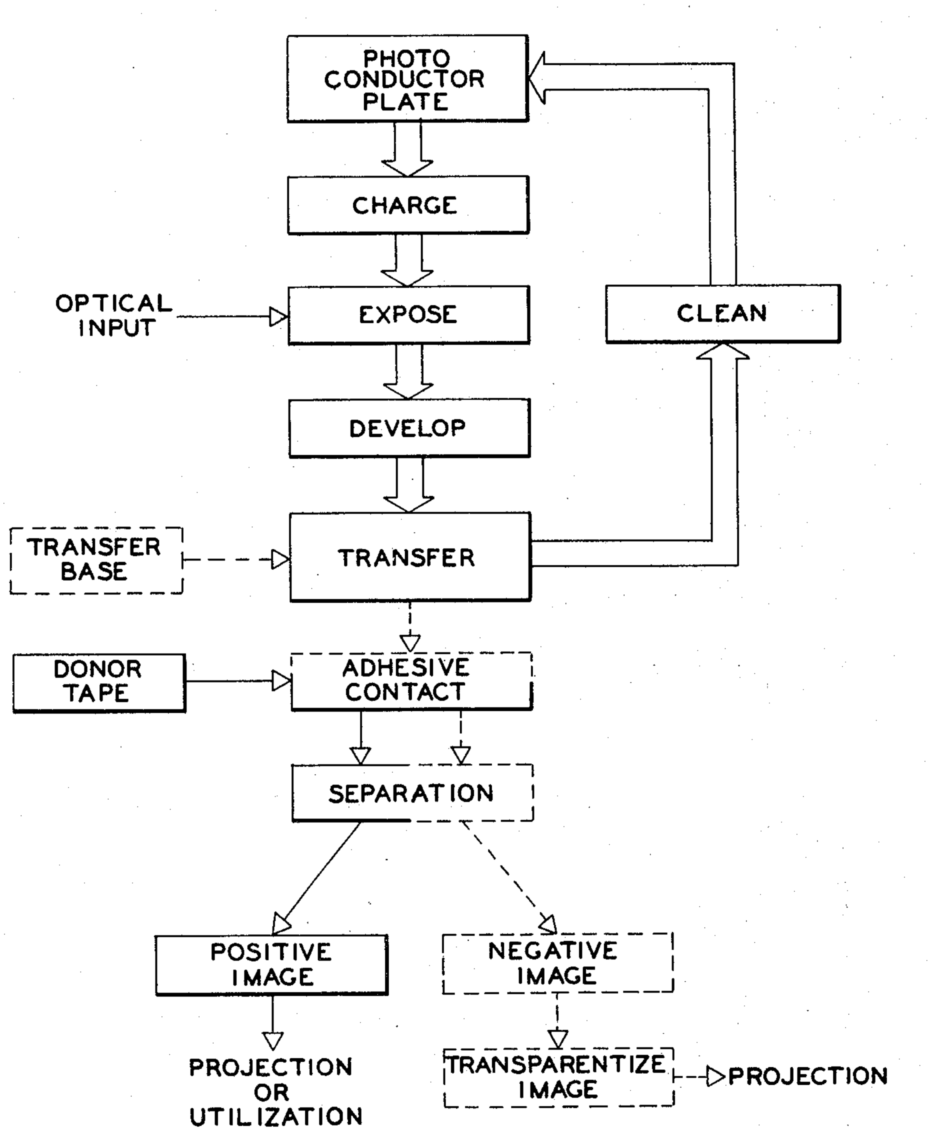
FIG. 1 is a process flow diagram of an embodiment in accordance with the invention.
Figure 3:
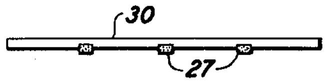
Figure 4:
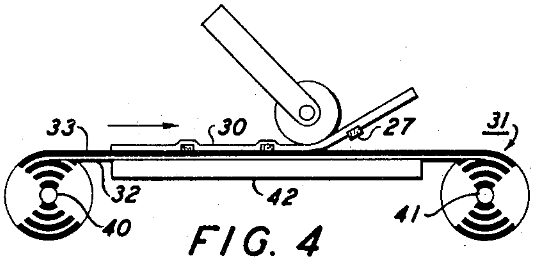
Figure 5B:
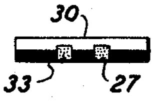
Figure 6B:
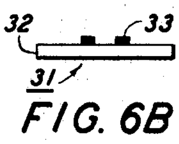
Figure 5A:
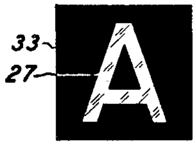
Figure 6A:
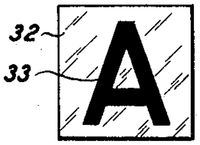
Figure 7:
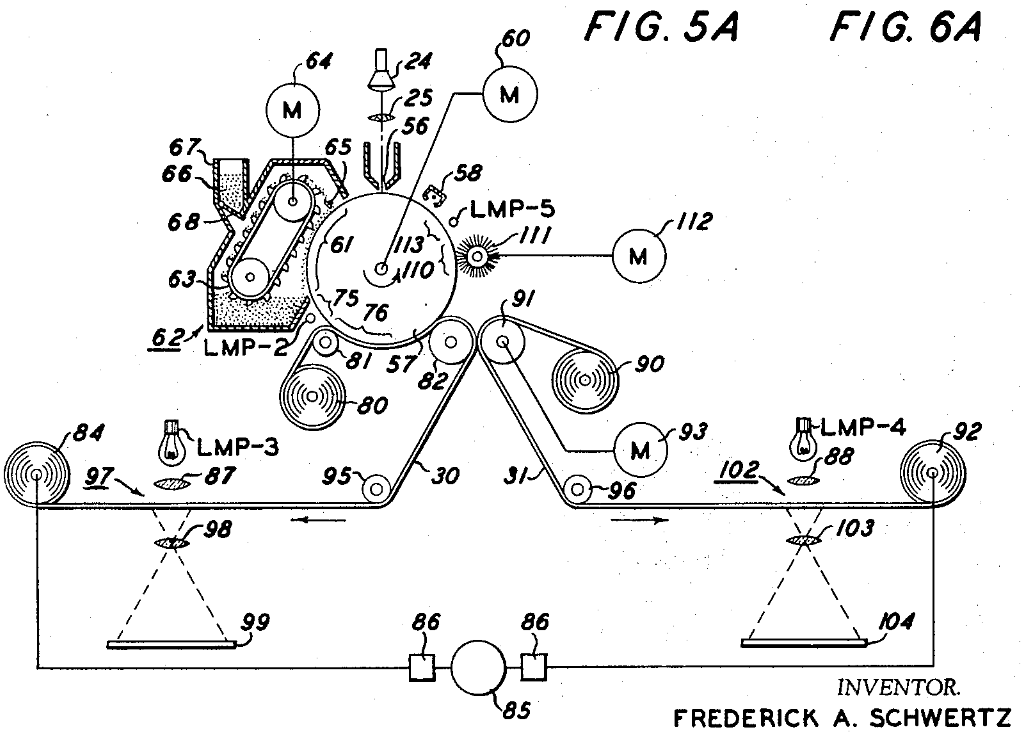
Figure 8:
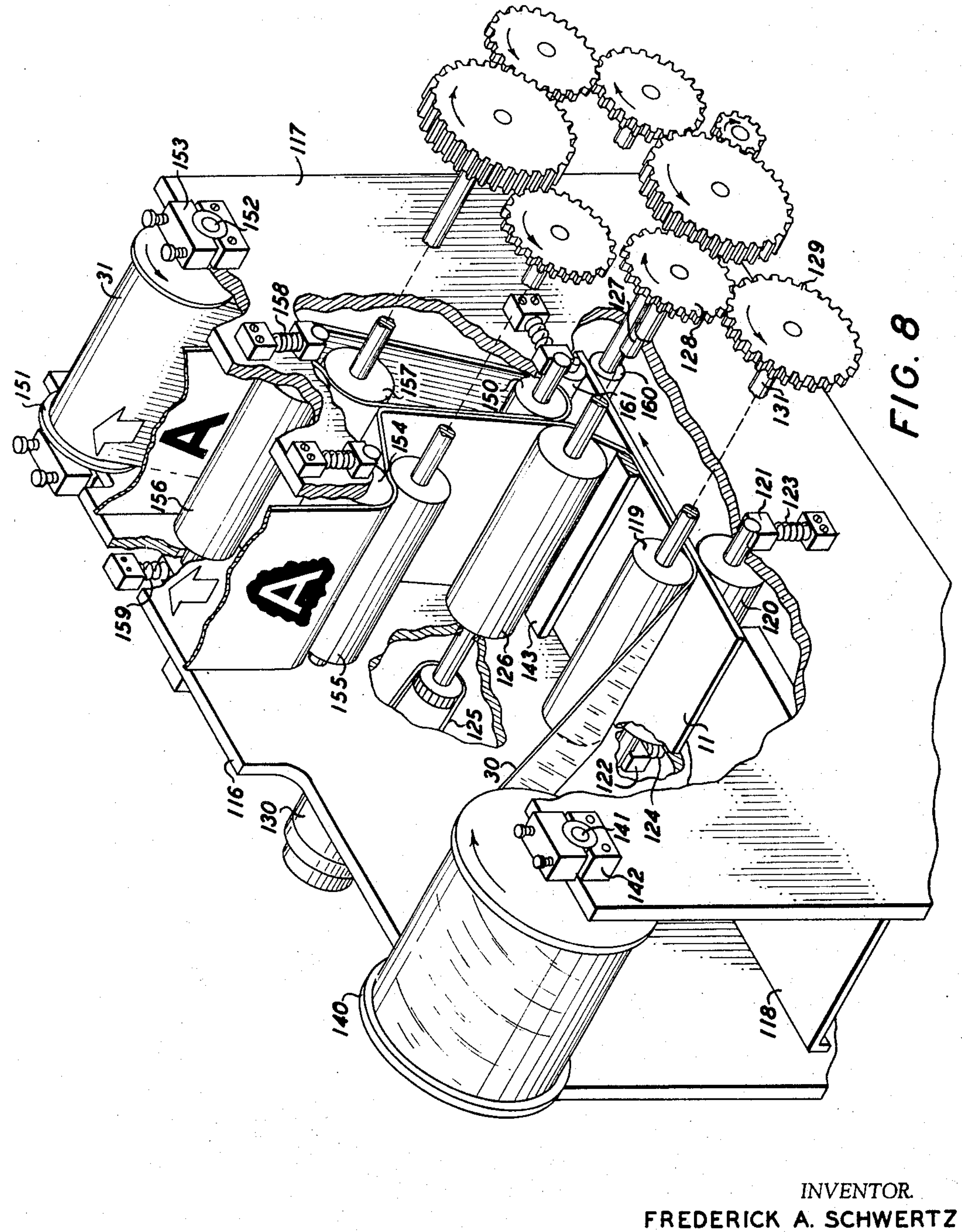
Figure 9:
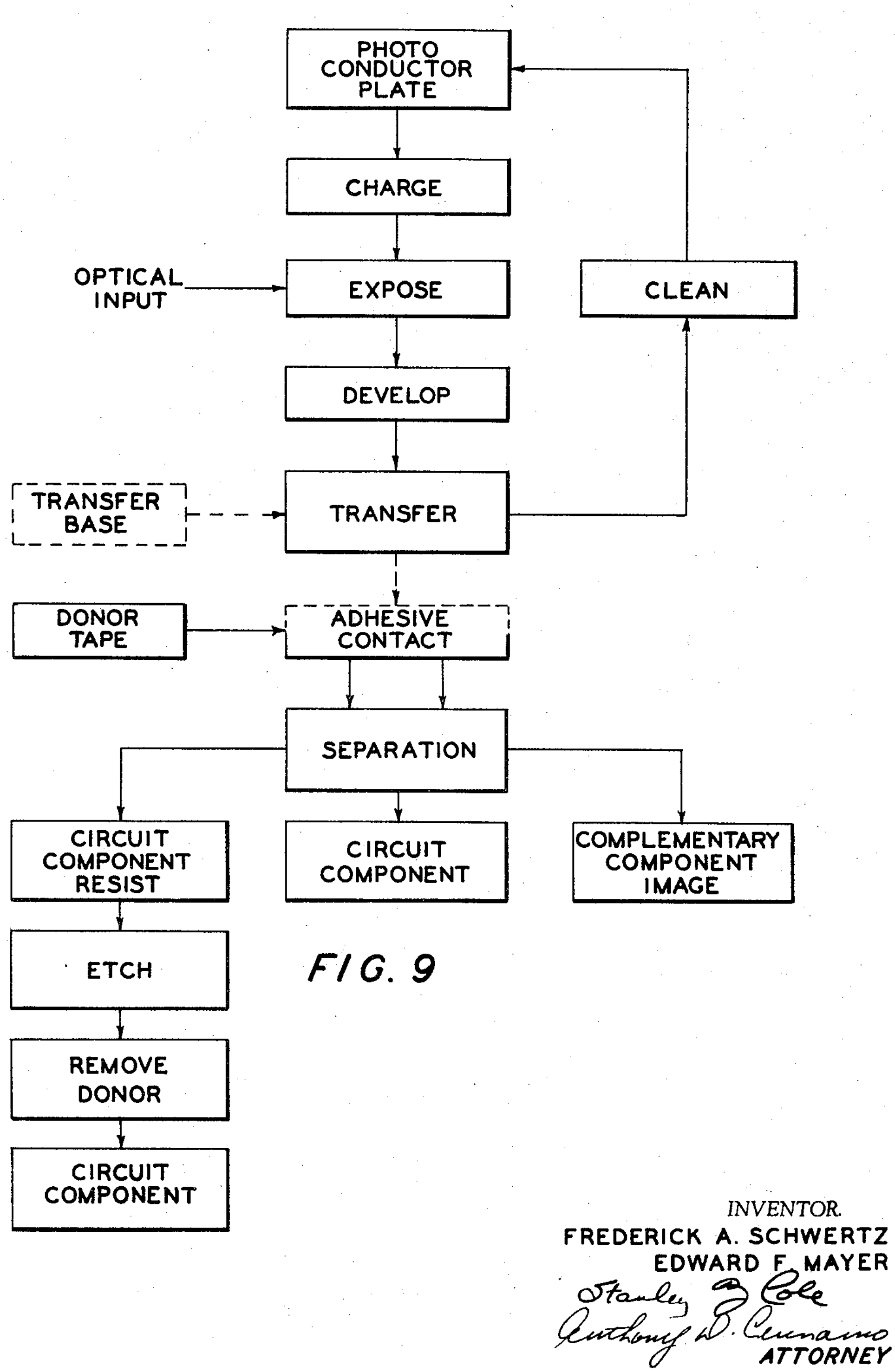
Figure 10:
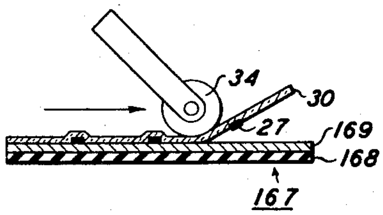
Figure 11B:
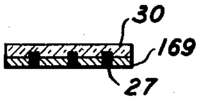
Figure 11A:
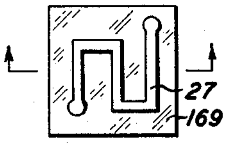

FIG. 3 diagrammatically illustrates the support base bearing an image;

FIG. 4 illustrates the application of the support base bearing the image against a second support base having a releasable donor film;

FIGS. 5*a* and 5*b* illustrate the resulting formation in section and plan respectively on the first support base after being stripped apart from the second support base in the relation of FIG. 4;

FIGS. 6*a* and 6*b* illustrate the second support base in section and plan respectively after being stripped apart from the relation of FIG. 4;

FIG. 7 schematically illustrates an apparatus for continuous operation of forming image projection transparencies in accordance with the method of the invention;

FIG. 8 is a partially exploded isometric view of apparatus for processing flat xerographic plates seriatim in accordance with the invention;

FIG. 9 is a variation of the process flow diagram of FIG. 1 for another embodiment of the invention;

FIG. 10 illustrates a contact step of applying as in FIG. 4, a support base bearing a resist image of a circuit component in accordance with another embodiment hereof against a second base on which a circuit component is to be formed;

FIGS. 11*a* and 11*b* illustrate the resulting formations in section and plan respectively on the first support base after being separated from the relation of FIG. 10.

Figure 12B:
Figure 12A:
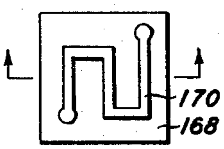
Figure 13:
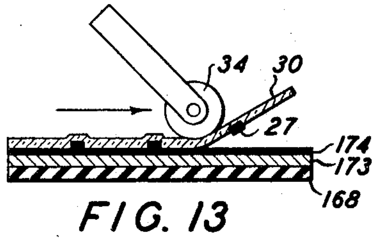
Figure 14:
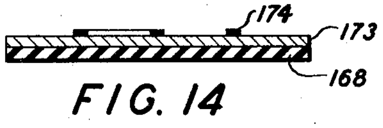
Figure 15:
Figure 16:

FIGS. 12*a* and 12*b* illustrate the resulting circuit component formation in section and plan respectively, following separation from the relation of FIG. 10;

FIG. 13 illustrates the contact step of applying a support base bearing a resist image against a substrate on which the component is to be formed in accordance with still another embodiment hereof;

FIG. 14 sectionally illustrates the formation on the substrate following separation from the relation of FIG. 13;

FIG. 15 illustrates the formation of FIG. 14 after application of an etching solution; and FIG. 16 is the resulting circuit component formed on the substrate of FIG. 15.

For a general understanding of this invention, reference is now had to FIG. 1 wherein the sequential flow steps in accordance with one embodiment are illustrated. The particular technique described uses xerography as, for example, disclosed in Carlson Patent 2,297,691 to form a powder image corresponding to copy being reproduced. However, there is no intention to limit this invention to operation only with xerography. As will be understood, an image is utilized as a resist and is employed in a subsequent transfer step so that any graphic image formed by whatever means, including any of electrical mechanical or chemical techniques such as photography, electrography, electrophotography, conventional forms of printing, stenciling or the like, otherwise suitable are intended to be encompassed herein. In order to simplify the presentation of this invention and its understanding, it will be described in terms of xerography.

The reproductions will be described as "complementary" and as being "positive" and "negative" as used in the conventional photographic sense. As will be understood as used herein, the terms can be interchangeably applied to different image formations depending upon characteristics of employed material as well as the image.

In the embodiment of the invention being described, there is employed a xerographic plate having a suitable photoconductive insulating layer overlying a conductive backing member. The photoconductive insulating layer may be any of a number of materials as, for example, sulphur, vitreous or amorphous selenium, zinc oxide in a resin binder, or other insulating binder films bearing photoconductive pigments or the like. The backing may comprise metal such as aluminum, brass or the like or may comprise paper or the like. The plates may be overcoated with organic or inorganic materials as, for example, disclosed in Owens patent U.S. 2,886,434. Functionally, the photoconductive layer may be described as a material able to retain electrostatic charge for a sufficiently long period to allow exposure and development of electrostatic charges on a surface and as a material which on exposure to activating radiation rapidly dissipates charge. The plate may also comprise a chemographic layer and images may be produced using chemographic techniques. For a fuller disclosure of such layers and how they are used, reference is made to pending application, Ser. No. 682,980, filed Sept. 9, 1957, in the name of Ebert.

Employing xerography, the plate is first charged to a uniform potential on the order of 100 to 800 volts as by well known forms of corona discharge or other charging devices. Charging may be of either polarity, the particular polarity depending on the layer being charged and is carried out in the absence of radiation to which a plate is sensitive.

After charging, the plate is exposed from an optical input representative of the image to be reproduced. Exposure causes dissipation of the charge in those areas struck by light resulting in a charge pattern of electrostatic charge corresponding to the optical input on the surface of the photoconductive insulating layer. It should of course be appreciated that other known techniques of forming a charge pattern are known and are intended to be encompassed by this invention.

Development of the electrostatic charge is generally used to render the charge pattern visible and may be accomplished by any of the methods well known in the art. Thus, one may readily employ a cascade development, brush development, magnetic development, powder cloud development, liquid development and the like. Numerous patents and other publications exist describing these and other developing systems which are readily usable in this invention and this will become more apparent as the description proceeds. It is noted at this point that the deposited marking material in accordance with certain embodiments of this invention need not include coloring material as is usually the case with xerographic developers.

Figure 2:
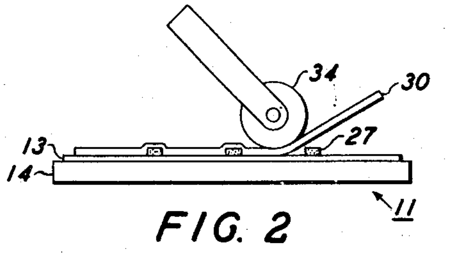
FIG. 2 illustrates transfer of image to a support base.

The transfer and related blocks of FIG. 1 are more fully illustrated in FIG. 2. There is illustrated in this figure transfer of a powder image from a xerographic plate, generally designated 11 and comprising a photoconductive insulating layer 13 on a conductive backing 14. It should be appreciated, however, that the image need not be in powder form. It could comprise a film or the like but for simplicity, the image will be discussed as a powder particle image. As illustrated, there is employed a web support base 30, which may be opaque, translucent or transparent depending on the ultimate use of the base. The web comprises a material at least having a surface either capable of being rendered tacky as by the application of heat, solvents, or the like with or without accompanying pressures or having a surface which is tacky such as an adhesively coated surface such as an adhesive or the like type tape. The web is applied with the adhesive surface (or with the surface while in an adhesive condition) against the powder image on the plate as by means of a roller 34. For the purposes of illustration, dimensional proportions are shown exaggerated. The toner, however, does become embedded or otherwise held in the tape surface. After application, the tape is removed and carries the powder image from the plate producing the article shown in FIG. 3 with powder image 27 adhering in image formation to the surface of tape 30.

Next subsequent, the article thus produced is placed, as illustrated in FIG. 4 (FIG. 1, Adhesive Contact Block) against a second web support base designated 31 and formed of a donor support backing 32, which may be opaque, translucent or transparent as will be understood, and on which is supported a releasable donor layer or film 33 as will be described. The donor material may conveniently be stored on a supply roll 40 and drawn onto a takeup roll 41 between which is a support platen 42. In accordance with FIG. 4, the base 30 bearing the powder image 27 is pressed firmly against the opaque donor film 33, coated on base 32 and lying over platen 42, as by a roller 43. In this position, web 30 should be tacky. This may be brought about by employing a material as web 30 which is naturally tacky or a material which is rendered tacky without affecting the donor film. It should also be appreciated that a non-tacky web may be employed if a tacky donor film or layer 33 is used. In this instance, the image should, itself, create adhesive areas so that substantially an adhesive contact is formed only between the non-image supporting areas of web 30 and the donor film. After the two webs attain an adhesive grip, they are stripped apart (FIG. 1, Separation) to produce the two separate complementary articles illustrated in FIGS. 5 and 6 and illustrated as blocks in FIG. 1 bearing the legend "positive" and "negative."

As may be seen in FIGS. 5 and 6, there is shown for illustrative purposes a letter A in complementary fashion. Thus the surface of web 30 is now completely covered by the combination of toner 27 in image configuration and donor film 33 in the remaining areas. With a proper choice of materials including a transparent toner 27 and an opaque donor film or layer 33, the article of FIG. 5 could constitute a negative image projection transparency with the image areas represented by the letter A being substantially clear and light transmitting. The light transmitting properties of the image can be enhanced to become increasingly transparent where required, i.e., the light scattering properties of unpigmented toner can be reduced by fusing by such means as heat or vapor or by coating the image with a material having a similar index of refraction, as a liquid or other encapsulating tape or by such other means known in the art.

Illustrated in FIG. 6, on the other hand, is the complementary article illustrated in FIG. 5. Likewise, with a proper choice of materials, including transparent base 32, and an opaque donor film 33, the article of FIG. 6 comprises a positive image transparency of the same letter A and includes the remaining donor film supported on a support base 32 following selective transfer. As described, there is simultaneously formed in accordance with this invention a complementary positive and negative image either or both of which may be opaque or transparent depending upon the preselection of materials as described.

Referring now to FIG. 7, there is illustrated schematically an automatic apparatus in accordance with the invention. The xerographic apparatus described herein may be an adaptation of the type disclosed in patent U.S. 3,076,392.

As here shown, a cathode ray tube 24 or any other suitable form of optical input is adapted to project an optical image through an objective lens 25 downwardly through a variable slit aperture assembly 56 and onto the surface of a xerographic plate in the form of drum 57. Where required, provision may be made to effect magnification change between the input and recorded image.

Xerographic drums 57 includes a cylindrical member mounted in suitable bearings in the frame of the machine and it is driven in a counterclockwise direction by motor 60 at a constant rate proportional to the movement rate of the original copy, whereby the peripheral rate of the drum surface is identical to the rate of movement of the projected light image. The drum surface being similar to plate 11 described above comprises a photoconductive material on a conductive backing that is sensitized prior to exposure by means of a corona generating device 58 energized from a suitable high potential source.

Exposure of the drum to the light image discharges the photoconductive layer in the areas struck by light, whereby there remains on the drum a latent electrostatic image in image configuration corresponding to the light image projected from the source of optical input. As the drum surface continues its movement, the electrostatic latent image passes to a developing station 61 at which a two-component developing material 62, which may be of a type disclosed in Patents 2,618,552; 2,638,416 or Reissue 25,136, is cascaded over the drum surface by means of a developing apparatus 62 which may be of a type disclosed in copending application, Ser. No. 393,058, filed Nov. 19, 1953, in the names of C. R. Mayo et al. is cascaded across the drum for development.

In the developing apparatus, developing material is carried by conveyor 63 driven by suitable drive means from a motor 64 and is released onto chute 65 and cascaded down over the drum surface. Since the toner component of the developer is partially consumed in developing, additional toner 66 is stored in the dispenser 67 and is released in amounts controlled by gate 68 to the developer to replenish and assure uniform development. Component 65 may also comprise an air knife to effect greater impetus to fine component developer.

After developing, the drum passes a discharge station 75 at which the drum surface is illuminated by a lamp LMP–2 to discharge residual charges on the non-image areas of the drum surface. Thereafter, the powder image passes to an image transfer station 76 at which the powder image is in this embodiment adhesively transferred to a continuous support surface web 30 drawn from a supply roll 80 over guide roll 81 into contact against the drum surface. The web is then directed over guide roll 82 and is stripped away from the drum surface with the powder image adhering thereto. At the same time, the web advances into pressure engagement against web 31 drawn from supply roll 90 and passing over a guide roll 91.

In passing over guide roll 82, web, 30, now containing the image adhesively transferred from the drum, is caused to be applied against web 31 drawn from supply roll 90. Thereafter, webs 30 and 31 are separated to effect an identical result as described in connection with FIG. 4 above. In order to ensure synchronous movement between guide roll 82 and guide roll 91, either or both may be driven from a motor 93. After separation, web 30 comprises one form of image as a negative image projection transparency which advances from guide roll 82 to guide roll 95. Beyond guide roll 95, the web may optionally move past a projection system 97 having a condensing lens 87, an objective lens 98 and a lamp LMP–3 to project the image onto a projection screen 99, and then onto take-up roll 84 being driven by motor 85 under control of slip-clutch 86. The slip-clutch arrangement 86 serves to ensure that the linear rate of web movement remains substantially constant as the diameter of take-up roll 84 increases. Similarly, web 31 formed an opposite complementary image and may, if desired, form a positive image projection transparency which advances over guide roll 91 to guide roll 96. Optionally, it may similarly move past a projection system 102 having a condenser lens 88 and an objective lens 103 and a lamp LMP–4 to project the image onto a projection screen 104 and then onto take-up roll 92 being driven also by motor 85 under control of a similar slip-cutch 86. Otherwise, the web may be directed to storage or the like for permanent recording purposes.

Speeds at which the mechanism of FIG. 7 can be made to operate will vary depending on such factors as rate of optical input, material properties limitations, desired resolution, etc. Operational speeds on the order of 10–20 inches per second have been found to be completely compatible with the invention such that original data is made available for utilization within about 1.5 to 4 seconds after the exposure step.

After separation of transfer web 30 from the drum, the drum surface passes through cleaning station 110 at which the surface is brushed by a cleaning brush assembly 111 rotated by a motor 112. This accomplishes removal of the residual developing material remaining on the drum. The drum surface then passes through a second discharge station 113 at which it is illuminated by a fluorescent lamp LMP–5 to remove any electrostatic charge on the drum. Suitable light traps are provided in the apparatus to prevent any light rays from reaching the light surface, other than the projected image, during the period of drum travel prior to sensitization by corona generating device 58 until after the drum surface is completely passed through the developing station 61.

Referring now to FIG. 8, there is illustrated apparatus for automatically processing flat xerographic plates containing a powder image which may have been formed from a still or substantially still exposure. A pair of parallel castings 116 and 117 provide the primary support. A plate 11 is first placed on a platen 118 from where it can conveniently be manually inserted into the bite of a pair of driven feed rolls 119 and 120 into pressure engagement against the adhesive surface of a web 30. Both feed rolls are supported for rotation with the lower roll 120 being supported between a pair of spring-mounted blocks 121 and 122 that are urged upward by a pair of springs 123 and 124 whereby a plate may be passed between the rolls under application of a substantially controlled pressure against the web. The top roll 119 is driven by motor 130, which through a timing belt and pulley arrangement 125 drives guide roll 126 having an axle 127 to which is secured gear 128 meshing with a gear 129 secured to axle 131 supporting feed roll 119.

The web 30 is adapted to pass in contact against a powder image supported on the plate and is drawn from a supply roll 140 suitably mounted for rotation about axle 141 and having a drag brake 142 connected to the roll to maintain tautness in the web being drawn. The web passes under feed roll 119 with its adhesive face in this embodiment against the powder image on plate 11 to be transferred and both the web and plate advance synchronously and in unison between the feed rolls.

The web and plate advance in unison until reaching the vicinity of a stationary supported stripper bar 143 whereat the web is stripped substantially tangentially from the plate along the forward edge of the bar. The web 30 is then caused to pass upward through a pair of guide rolls 126 and 150, the former of which is driven and both being supported similarly as rolls 119 and 120 having a controlled pressure application by means of springs 158 and 159 and wherebetween the web 30 comes into face-to-face contact with the releasable opaque donor film on web 31.

The web 31 is contained on a supply roll 151 mounted for rotation on an axle 152 and to which is secured an adjustable drag brake 153 in order to maintain tautness in the web 31 being drawn. On being drawn from the supply roll, the web is caused to be wound about guide roll 150 into face-to-face contact against the web 30 containing the transferred powder image. On passing between guide rolls 126 and 150, both webs come into physical pressure contact uniformly against each other such that the adhesive surface contained on web 30 is firmly pressed against the releasable donor film contained on web 31. The webs continue to advance through the guide rolls until approaching a pair of separating guide rolls 154 and 155 and 156 and 157 that cause the two intimately positioned webs to be separately directed and be stripped apart. Each of the latter guide rolls are mounted for rotation with web 30 being guided through the bite of feed rolls 154 and 155, while web 31 is caused to pass and emerge from between guide rolls 156 and 157. Thus, as these two webs are separately guided into their respective feed rolls, they are caused to be stripped apart and effect a transfer in the manner described above whereby complementary images are formed on the respective webs.

In the meantime, plate 11, from which the powder image has been transferred, is caused to continue to be advanced between a pair of feed rolls 160 and 161 that pass the plate to a suitable dispensing location. Thereafter, each of the webs may be separately cut to remove the individual images thus formed or may be utilized continuously or otherwise as required.

By the description thus far, there is disclosed the simultaneous formation of complementary images formed simultaneously on webs 30 and 31. For forming negative image transparencies, web 30 is preferably on a transparent expendable type of material having a face either adhesively coated or capable of being rendered sufficiently adhesive to transfer the donor film from web 31. Where an adhesive tape is employed, the photoconductive layer supported on a xerographic plate from which the powder is to be transferred should be adequately bonded so as not to be removed by the type being stripped therefrom and may include reusable type plates such as those employing vitreous selenium as the photoconductor or such other commercially marketed plates as those employing zinc oxide in a suitable binder. It has been found, however, that the laboratory worker can readily develop techniques to strip the tape carefully without removing the photoconductive layer and the fact that the photoconductor can be stripped when care is not exercised is not intended as a limitation on the bonding required.

Obviously many materials have various orders of suitability, are commercially available or can be adapted for the role of web 30. For transparency formation, "Mylar" polyester film backed tapes have exhibited greater strength and greater dimensional stability than either acetate or cellophane although all have been employed in successfully carrying out the invention. Available commercial forms of masking tapes were found suitable for low resolution reproduction not requiring transparency. Desirably, the tape should have an adhesive layer capable of complete toner removal from the photoconductor without flowing through or around the toner material if an adhesive web is being employed so that the image areas will prevent stripping of the donor film or layer. At the same time if an adhesive web is used, adhesion must be adequate for substantially complete removal or stripping of the donor film from the donor web 31 during this manipulation.

As a general matter, the main control on the resolution of images formed is the resist image. Any image capable of comprising a resist against donor transfer can be employed. When employing xerography for forming the graphic or resist image, the developer, its particle size if of powder, its fidelity, and the like, affect ultimate resolution. Generally, it has been found that no perceptible loss of resolution results because of the additional steps of this invention. However, it should be appreciated, as a lens can affect quality in a projection of an image, it is believed that the other steps of this invention may slightly deteriorate quality in the images produced. Whether or not this is so, ultimate quality is defined by the quality of the resist image itself. With cascade carrier type development, for example, image resolution of 120 line pairs/mm. have been obtained. In order to accomplish this, it became necessary to use small size toner particles. To effect quality development in a cascade system, it was also found desirable to use small carrier particles. It is basic to the cascade system that in a given mass of carriers, the number of carriers are a cube function of their size in a load of developer for a given amount of toner. The significance of this is that as developer cascades over the plate surface, the number of contacts to a given area increases greatly with a decrease in carrier diameter. This factor together with the fact that such a relationship between toner and carrier exists allows the toner to deposit more easily and to recognize the charge being developed. Carriers of about .003 inch to .005 inch in diameter have been proven compatible in producing image resolutions of 120 line pairs/mm. and the toner in such a developer was a micron or less in size. The use of powder cloud or liquid development systems are capable of producing higher resolution images and thus may be employed where resolutions in excess of about 100 line pairs/mm. are desired.

Ultimate resolution in a particle developing system is the individual particle size. As should be apparent for high resolution, uniformity in particle size is also necessary. In addition, low density developments are desired in a high resolution system since with higher densities toner tends to pile in development such that for fine lines, small particle sizes are needed to avoid line spreading. Where resolution is not a consideration, particle size is not a critical factor but is dependent on ultimate use requirements. For example, 40 line pairs/mm. resolution cannot be consistently resolve by particles on the order of 10 to 12 microns but if lower resolution is acceptable, larger particles may be used. Desirably for high resolution, the particles should be about ⅓ to $\frac{1}{10}$ the size of the narrowest line to be resolved and image density in development should comprise piling not more than 1 to 1½ particles high.

To assure maintenance of resolution when the developed image is transferred in a high resolution system employing adhesive type transfer techniques, a "hard" adhesive should be employed with a "low quick tack." Such a material is a pressure sensitive adhesive with a high creep resistance and about a three-pound peel strength per inch of width as measured when being removed from polished stainless steel at 72° F. employing a 180 degree peel angle at the rate of four feet per minute. This class of adhesiveness is not intended herein as a definition of operability limits or as defining criticality but is included for purposes of providing complete disclosures. Operability in a practical sense is a function of the image resolution desired and resolution as is now apparent will depend on many factors. Materials found suitable include cellophane tapes, masking tapes, household adhesive tapes including friction tapes, supports coated with a tacky layer such as rubber cement, and the like.

Web 30 may also comprise dye transfer paper or a polyethylene sheet. To accomplish transfer to dye transfer paper, the paper is wetted and then pressed against the image bearing surface. This transfer technique is fully described in Andrus, U.S. Patent 2,843,499 and reference should be made thereto for additional details. The polyethylene transfer technique involves the use of a prepared sheet fully described in U.S. 2,855,324 which is pressed against the image surface as described in this same patent.

As has been pointed out previously, transfer of the image may also be employed which is not dependent on adhesiveness or the like in the transfer web. Thus one may use conventional electrostatic transfer techniques or the like to any of various known ordinarily used transfer surfaces.

Also as has been noted previously, the object of forming a resist can readily be accomplished by forming the resist as through stenciling techniques or the like directly on the web member or even on the donor layer. In this embodiment of the invention, xerography or related systems need not be used.

The donor film or layer 33 and its support base 32 likewise play an important role in the instant process and these should include appropriate properties compatible with the other materials being used. The film or layer 33 produces better quality images if uniform. This is more readily accomplished if the base presents a smooth surface for the film. In addition, if high image resolution is of interest, support layer 32 should preferably be a relatively thin flexible section on the order of about .001 inch or less. Flexibility in support 32 allows the donor film to flow about the image and thinness in this layer also is of value in making the contact complete. For images having relatively low resolution, films of ⅛ inch thickness have been used. It should, of course, be appreciated that support 32 need not be a thin layer but may comprise a solid member such as wood, plastic elements, metals or the like. If support 32 is not transparent as when a thick metal member is employed, the image produced should contrast with the surface for reading purposes.

The internal bond of the donor film should be great enough to permit complete stripping of the film from the base. Additionally, the base material should offer a bond to the donor film of a force greater than the transverse internal bond or strength of the film. Preferably, the base should be of an expendable material, although reusable materials such as various forms of glass and metals are not excluded and are of value for particular applications. Polyester films have been found to work well as the base due to their general utility, dimensional stability and high strength. They are also of value because of their transparent qualities.

The opaque donor film or layer 33 contained on base 32 should be adequately and uniformly opaque throughout and at the same time, desirably ought to be uniformly releasable to adhesives employed. Evaporated metal coatings of antimony, aluminum and silver have exhibited properties suitable for the process hereof as well as particulate dispersions. The use of metal coatings will be further described in connection with another embodiment hereof for forming printed circuit elements. With this embodiment of the invention as carried out, it was found that opaque particulate dispersion, dispersed in a thin, uniform film coated onto the base performed very effectively. Electrophoretic deposition gave controlled uniform thicknesses with good adhesive retention. Ordinarily, dispersing agents such as tannin, or sulfonated oils as low as 0.1 percent by weight are useful to maintain the particles in suspension and to provide adequate bond between particles. The binder need only be sufficient to cement the material and not to provide continuity. Bonding may also be enhanced by incorporating from about 0.5 percent to about 20 percent by weight of a plastic material such as acrylics, polystyrenes, methylates, etc. Graphite and carbon blacks are ideal pigments due to their fine particle size and opacity but most other pigments will operate. Various "Dag" suspension forms of the Acheson Colloids Co., have worked well. Metal powders and pigments such as iron oxide and zinc chromate as well as colloidal suspensions of magnesium and chromium have worked well. One can use a dyed binder alone or if chemical reactions are built into the other elements, as through the use of color causing reacting toner or support base in the image material or its carrier surface, one need not use colored or opaque material in the donor film or layer 33.

Thickness of the donor film is not considered critical and is largely a function of resolution to be attained. Generally thickness ranges from about .0001 inch to produce about 70 line pairs/mm. and above and to about .0003 inch and over for 40–50 line pairs/mm. However, operable films have been prepared ranging down to 1000 angstroms employing evaporated metal coatings and up to .001 inch thickness for particulate film from which fine results have been attained. Still thicker films on the order of $\frac{1}{16}$ of an inch have been employed for applications in which high resolution is not a primary consideration as in the preparation of braille images and, of course, still thicker films or layers may be used.

In accordance with the invention, the developed image need not be highly legible or even legible at all, it being sufficient that it afford resistance to donor transfer. By this means, a thin low contrast developed image can be utilized to produce a high contrast reproduction such as a transparency. In effect, the process of the invention achieves a quantum gain in photographic speed or sensitivity over conventional line copy reproduction by its ability to convert a low density, low contrast image to one of high density and high contrast. Gains of 4 to 1 have been general and gains of 10 to 1 have been achieved.

The following exemplifies in a preferred embodiment the process of the invention for application of forming complementary and simultaneous reproductions of positive and negative projection transparencies. Toner of about ¾ to 1 micron and with an absence of pigment material was employed with about 100 micron carriers to cascade develop a high resolution image on a 10 micron or 20 micron vitreous selenium photoconductor supported on a brass substrate. Exposure of the plate was about ⅓ of that used in conventional commercial xerographic equipment using selenium layers. The developed image was adhesively transferred to an adhesive tape, of a type commercially marketed by the Minnesota Mining and Manufacturing Company, as brand 853 Mylar tape. For transfer, the tape was applied firmly and adhesive side down against the developed image and then tangentially peeled off. To assure uniform contact the tape was rolled with a roller against the selenium surface. A donor film had been formed on a ½ mil Mylar base by dip coating thereon a colloidal suspension of graphite in a solvent with a dispensing or binding agent of a type marketed commerically as dispersion No. 154, by the Acheson Colloids Company. The tape bearing the resist images was then rolled against the donor film. The tape was then stripped producing as illustrated in FIG. 8, a negative image transparency on the adhesive tape and a positive image transparency on the donor base, each having image resolutions on the order of 120 line pairs/mm.

There has thus far been described a novel method of image reproduction capable of wide latitudes of sensitivity, fidelity as well as utility. By virtue of the quantum gain benefits, images of low light intensity can be transformed into high density reproductions. By a proper choice of materials, extremely high resolution images can be attained. In addition, donor films such as the particulate dispersion described above are characterized by clean, sharp breaks giving sharp edges and corners. The abrupt transition, as compared to prior art techniques in which the transition has associated bleeding between colors, results in extremely high definition. With this control over resolution as well as high definition, it has been found possible to produce high quality half-tone reproductions. In addition, since very high resolution is possible, continuous tone renditions are producible. In effect, following the teachings of the instant invention and employing high resolution half-tone processes, one approaches grain size as found, for example, in high quality photographic systems to result in high quality continuous tone renditions. In addition, the process lends itself not only to forming black and white image transparencies but also to multicolor transparencies.

It is not intended that size of the formed transparencies be in any way limited. Rather, the ultimate size can be a function of the requirements for the application and may include magnification changes between the original and final reproduction producing microimages or extreme enlargements.

Consider now the two embodiments hereof for forming printed circuit components. By referring to FIG. 9, it may be seen that the initial steps in the formation described in connection with FIG. 1 are common to these latter embodiments through the steps of "separation" except as will be described hereafter.

A resist image is first formed onto tape 30 as described in connection with FIGS. 2 and 3. Next subsequent, in accordance with the first circuit formation of the invention, tape 30 is placed as illustrated in FIG. 10 with the adhesive side against a circuit board generally designated 167 on which the electrical component is to be formed. The board is comprised of a substrate 168 generally being a planar member having dielectric properties and high mechanical strength, as, for example, a phenol formaldehyde laminate, a ceramic material, etc., as is conventional in the printed circuit art and on which has been previously coated a thin layer or film 169 of the material composition of which the circuit component is to be formed. Film 169 in accordance with this first circuit formation is releasable retained on the substrate in such a manner that it can be stripped away by adhesive pull as described in connection with member 31 above. Further, whereas a single layer is illustrated, it should be understood that any feasible number of layers successively applied can be employed so long as the exposed layer is adhesively releasable from its supporting layer below.

In accordance with FIG. 10, the base 30 bearing the powder image 27 is pressed firmly against the film 169 on base 168 as by roller 34 to attain a firm adhesive grip between the tape and film in areas devoid of the powder resist. For this step of the process, tape 30 should be in its tacky adhesive state either naturally or conditioned as aforesaid without adversely affecting or attacking the circuit component film 168. It should also be appreciated that a non-tacky web can be employed if the surface of component film 169 is rendered tacky in any way. In the latter instance, the powder image should, itself, create adhesive areas so that an adhesive contact is formed only between the non-resist supporting areas of the tape 30 and those corresponding areas of the circuit component film 169, it being essential only that adhesive contact be established between the film 169 corresponding to the areas of tape 30 devoid of a powder image thereon. After the two webs attain an adhesive grip as aforesaid, they are stripped apart (FIG. 9, "separation") to produce the complementary articles illustrated in FIGS. 11 and 12 and illustrated as blocks in FIG. 9 bearing the legends "circuit component" and "complementary component image."

As may be seen in FIGS. 11 and 12, there is shown a typical configuration representative of the component to be formed. Thus, the surface of tape 30 in FIG. 11 is now completely covered by the combination of developer 27 in component configuration and the component film 169 in the remaining areas.

In FIG. 12, there is shown the completed micro 2D circuit component in accordance with this embodiment designated 170 formed by the removal of the undesirable areas of film 169 to the article of FIG. 11.

Film 169 should preferably be of uniform thickness and relatively smooth throughout. This is more readily accomplished where the base presents a smooth surface for the film. In addition, if high image resolution is of interest, the substrate can be relatively thin and have some flexibility. Flexibility in the substrate allows film 169 to flow about the image and thinness in this layer also is of value in making the contact complete. It is usual, however, to use substrates on the order of about 1/32 of an inch thick of a rigid material such as ceramic.

The internal bond of film 169 should be great enough to permit complete stripping of the film from its support. Additionally, the support should afford a bond to the component film of a force greater than the transverse internal bond or strength of the film, but should be uniformly releasable to the adhesives employed. Suitable for forming circuit components in accordance with this embodiment of the invention are, by way of example, aluminum, silver, and copper evaporated onto a ceramic substrate with thicknesses on the order of 0.01 micron to 10 microns. Also suitable are chemically deposited layers listed by the following examples:

*Example 1*

A suitably bonded resistive layer of about 100 to 1000 angstroms thickness was found to deposit onto a dielectric ceramic substrate by immersing the substrate in a one percent solution of tin methylate for approximately five to ten seconds. On withdrawal of the substrate from solution, heat was applied at a temperature of approximately 60° C. to convert the alcoholate to a tin oxide having resistive properties.

*Example 2*

Chromium was used to form a resistive layer after initially preparing a dielectric ceramic substrate by immersing it in a sensitizing solution of tin chloride, followed by a water rinsing and immersion in a seeding solution of palladium chloride and then rinsing again. A layer of chromium was then deposited in accordance with the electroless process disclosed in Eisenberg Patent U.S. 2,829,059.

*Example 3*

A conductive layer of copper of between 1000 and 2000 angstroms was deposited after seeding and sensitizing as in Example 2 onto an immersed substrate having a previously applied resistive layer of tin oxide from a solution prepared in accordance with the following proportions: 4 grams of copper sulfate; 15 grams of Rochelle salts; and 9 grams of sodium hydroxide all dissolved in 1,000 mil. of distilled water and mixed in solution with 200 mil. of formaldehyde.

*Example 4*

A conductive layer of copper of between 1000 and 2000 angstroms was applied over a previously applied resistive layer of chromium utilizing the same procedure and solution described in Example 3.

*Example 5*

Nickel of between 1000 and 2000 angstroms deposited after seeding and sensitizing as in Example 2 onto an immersed substrate having a previously applied resistive layer of tin oxide from a solution prepared in accordance with the following proportions: 10.7 oz./gal. of 80 oz./gal. nickel chloride solution; 1.33 oz./gal. of sodium hypophosphite; and 1.33 oz./gal. of sodium citrate, the solution being maintained approximately between 68° to 81° C. at a pH factor of approximately 4.

*Example 6*

Nickel of between 1000 and 2000 angstroms was applied over a previously applied resistive layer of chromium utilizing the same procedure and solution described in Example 5.

*Example 7*

Nickel of between 1000 and 2000 angstroms deposited after seeding and sensitizing as in Example 2 onto an immersed substrate having a previously applied resistive layer of tin oxide from a solution prepared in accordance with the following proportions: 4 oz./gal. of 80 oz./gal. nickel chloride solution; 1.7 oz./gal. of ammonium hydroxide; 1.0 oz./gal. sodium hypophosphite; 6.5 oz./gal. of ammonium chloride, and 9.5 oz./gal. sodium citrate, the temperature of the solution being maintained at approximately 68° to 82° C. in a pH of approximately 8 to 10.

*Example 8*

Nickel of between 1000 and 2000 angstroms was applied over a previously applied resistive layer of chromium utilizing the same procedure and solution described in Example 7.

*Example 9*

A dielectric layer of approximately 8,000 angstroms was found to be suitably formed on a previously applied metallic layer from a solution formed by dissolving magnesium in absolute methanol to form a one percent solution of magnesium methylate. After five to ten seconds of immersion in this solution, the substrate was removed and the film of solution thereon hydrolyzed by applying heat at a temperature of about 60° C. whereby to form a magnesium oxide film having dielectric properties.

*Example 10*

A conductive layer of copper of about 1000 to 2000 angstroms was deposited in about eight to ten minutes onto an immersed substrate having a previously applied dielectric layer of silicon monoxide, by first sensitizing and seeding the layer (one–two minutes each as in Example 2), from a solution prepared in accordance with the following proportions: four grams of copper sulfate, 15 grams of Rochelle salts and nine grams of sodium hydroxide all dissolved in 1,000 mil. of distilled water and mixed in solution with 200 mil. of formaldehyde.

Each of the examples are typical of methods that can be employed for applying a strippable layer to a substrate or for applying a subsequent strippable layer to a strippable or nonstrippable layer previously applied and in turn, supported on the substrate. It is not intended, however, that the invention be limited by the method and compositions of the examples, nor to the order of succession in which the layer are applied in the manner of the examples or as hereinbefore described. Obviously, each layer could be formed from other compositions known to those skilled in the art, and are intended to be encompassed herein.

Referring now to FIG. 13, there is illustrated a second circuit formation in accordance with the invention. In accordance with the embodiment hereof, the component film, here designated 173 of which the component is to be formed, is applied previously onto the substrate as by evaporation techniques, chemical deposition, ionic or electronic bombardment, etc., supported overcoating the component film and adhesively releasable therefrom is a thin strippable donor layer or film 174 which should have the properties of an etching resist as will be understood, and which is strippable in a manner similar to layer 33 and the component film 169 described above.

In carrying out this latter embodiment, the adhesive-resist bearing side of tape 30 (if in fact a tape is employed as discussed above) is applied in contact with the donor film as by a roller 34 to obtain a firm adhesive grip as aforesaid and then removed. Separation strips the donor film away from the component layer in those areas complementary to the component configuration to be formed and resulting in a substrate supported structure illustrated in FIG. 14.

Next subsequent, the areas of the component film exposed by removal of the donor film are etched by a suitable etching solution which does not attack the remaining donor resist. This results in the structure illustrated in FIG. 15 in which the circuit component designated 175 is formed below the donor resist 174. Following etching, the resist donor film still covering the component can be adhesively removed to expose the component producing in accordance with the second formation embodiment the completed micro 2D circuit component shown in FIG. 16.

For this latter embodiment, the donor film should generally be of a hydrophobic material such an an oil suspension of a particulate dispersion uniformly coated onto the component film. Various dag suspension forms of the Acheson Colloids Company, such as an oil suspension 204 work well. It is otherwise characterized generally as described above in connection with layer 33.

Etching solutions used in accordance with the latter embodiment are well known in the art and the chemical composition of each solution is a function of a material composition to be etched as well as the supporting material below, if existent, that will become exposed by the etching step. For example, copper may conveniently be removed by applying a solution of ferric chloride to form conductive lines under the resist for conductors or capacitors. Conductors formed of nickel or aluminum may be etched in a bath of nitric acid and sodium hydroxide, respectively. Similarly, resistors may be formed from a chromium layer, the unprotected areas of which are removed by first dusting the layer with a fine zinc powder from a duster and then applying a solution of hydrochloric acid; while a dielectric of magnesium oxide can be etched with nitric acid without attacking an underlying layer of aluminum. Similarly, nitric acid wll not attack a layer of chromium underlying a layer of nickel. To enhance the hydrophobic character of the resist during the etching step, the resist can be overcoated as with a silicone oil.

It is possible by employing a donor film sandwiched between two successively applied layers, to combine the two described circuit forming embodiments. Also, although ceramic has been frequently mentioned for the substrate, other suitable substrates would include plastics and reinforced plastics commonly used for printed circuit boards such as grade G–10.

There has thus been described a novel method of forming 2–D electrical components for printed circuits. Not only are the methods of the invention characterized by simplicity and rapid preparation but by a proper selection of materials, extremely high resolutions can be obtained. In addition, it has been found that the stripping step utilized herein results in clean, sharp breaks giving sharp edges and corners. With this control over resolution as well as definition, it has been found possible to produce high quality electrical components for 2–D printed circuit boards. It is not intended that the size of the formed components be in any way limited. Rather the ultimate size can be a function of the requirements for the application and can be utilized for large circuit boards as well as for microminiaturization as preferred. It is further not intended to be limited to any named material since any suitable material combinations giving results consistent with the above description of the invention are intended to be encompassed herein.

Whereas high resolution reproduction has been distinctly emphasized as an advantage of the instant invention, it should be apparent that the scope of the invention is much broader and diverse.

Since many changes could be made in the above construction and many apparently widely different embodiments of this invention could be made without departing from the scope thereof, it is intended that all matter contained in the drawings and specification shall be interpreted as illustrative and not in a limiting sense.

What is claimed is:

1. A method of forming an electrical component on a carrier support comprising forming a pattern of non-adhesive material in the shape of the component to be formed on an adhesive surface of a transfer support, bringing said pattern of non-adhesive material and the adhesive surface of the transfer support into contact with an adhesively strippable donor film overcoating a layer of material on a carrier support from which the component is to be formed, separating the carrier and transfer supports to transfer the donor film not lying under the pattern of non-adhesive material from the carrier support to the transfer support, applying a chemical etchant to the component material to remove said material from the carrier support except in the areas under the chemically resistant donor film thereby forming the electrical component on the carrier support.

2. The method according to claim 1 wherein the step of forming a pattern of non-adhesive material on an adhesive surface of a transfer support includes forming a xerographic powder image of the electrical component to be produced, and depositing said xerographic powder image on the adhesive surface of said transfer support.

3. The method according to claim 2 further including the step of removing the donor film remaining subsequent to etching to expose the electrical component formed on the carrier support.

References Cited

UNITED STATES PATENTS

| | | | |
|---|---|---|---|
| 2,895,847 | 7/1959 | Mayo | 117—17.5 |
| 2,996,400 | 8/1961 | Rudd et al. | 117—17.5 |
| 3,166,418 | 1/1965 | Gundlack | 117—17.5 |
| 3,166,420 | 1/1965 | Clark | 117—17.5 |
| 3,219,509 | 11/1965 | Kinsella | 156—13 X |
| 3,275,436 | 9/1966 | Mayer. | |

JACOB H. STEINBERG, *Primary Examiner.*

ALEXANDER WYMAN, *Examiner.*